United States Patent [19]

Elizondo

[11] Patent Number: 5,300,838
[45] Date of Patent: Apr. 5, 1994

[54] AGILE BANDPASS FILTER

[75] Inventor: Eduardo L. Elizondo, East Windsor, N.J.

[73] Assignee: General Electric Co., East Windsor, N.J.

[21] Appl. No.: 886,011

[22] Filed: May 20, 1992

[51] Int. Cl.$^5$ .......................... H03K 5/00; H04B 1/26
[52] U.S. Cl. .................. 307/521; 328/138; 328/167; 455/314
[58] Field of Search ............... 307/520, 521; 328/165, 328/167; 333/174; 455/314, 318, 315; 331/22, 31

[56] References Cited

U.S. PATENT DOCUMENTS

| | | | |
|---|---|---|---|
| 2,747,084 | 5/1956 | Doelz | 325/432 |
| 2,998,517 | 8/1961 | Beckerich | 250/20 |
| 3,090,923 | 2/1958 | Wolff | 328/93 |
| 3,528,040 | 12/1968 | Glavin | 333/18 |
| 3,668,570 | 6/1972 | Lautier | 333/70 |
| 3,887,874 | 3/1975 | Reed | 328/167 |
| 3,967,102 | 6/1976 | McCown | 235/152 |
| 4,267,605 | 5/1981 | Matsuzawa et al. | 455/266 |
| 4,310,803 | 6/1982 | Kurihara et al. | 328/167 |
| 4,480,236 | 10/1984 | Harris | 333/174 |
| 4,516,078 | 5/1985 | Vanagihara et al. | 328/167 |
| 4,542,524 | 9/1985 | Laine | 381/53 |
| 4,583,060 | 4/1986 | Mawhinney | 331/172 |
| 4,696,055 | 9/1987 | Marshall | 328/167 |
| 4,768,205 | 8/1988 | Nakayama | 375/15 |
| 4,814,727 | 3/1989 | Mower | 331/2 |
| 5,108,334 | 4/1992 | Eschenbach et al. | 455/314 |

Primary Examiner—Timothy P. Callahan
Attorney, Agent, or Firm—W. H. Meise; C. A. Berard; S. A. Young

[57] ABSTRACT

Two variable frequency, fixed bandwidth bandpass 10, 410 are cascaded to form a bandpass filter with variable center frequency and variable bandpass. Each filter 10, 410 includes first (16, 416) and second (24, 424) mixers separated by a fixed bandpass filter (20, 420). Each mixer includes a control input terminal 30, 32: 430, 432 which receives a control signal ($f_{LO}$, $f_{OFF}$). The center frequency of the filter arrangement is controlled by the frequency of control signal $f_{LO}$, and the bandwidth is controlled by the difference frequency between $f_{LO}$ and $f_{OFF}$. A tracking arrangement 456 allows direct control of the bandpass by control of the frequency of an offset oscillator 458.

8 Claims, 5 Drawing Sheets

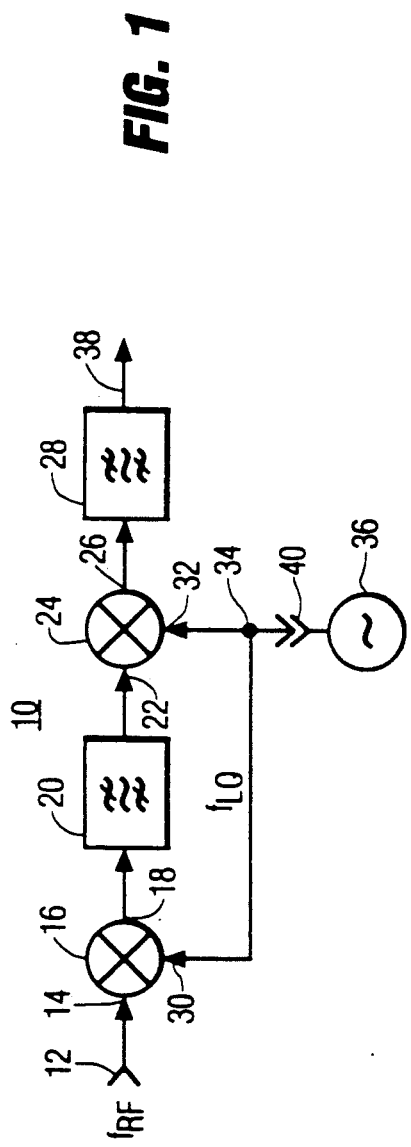
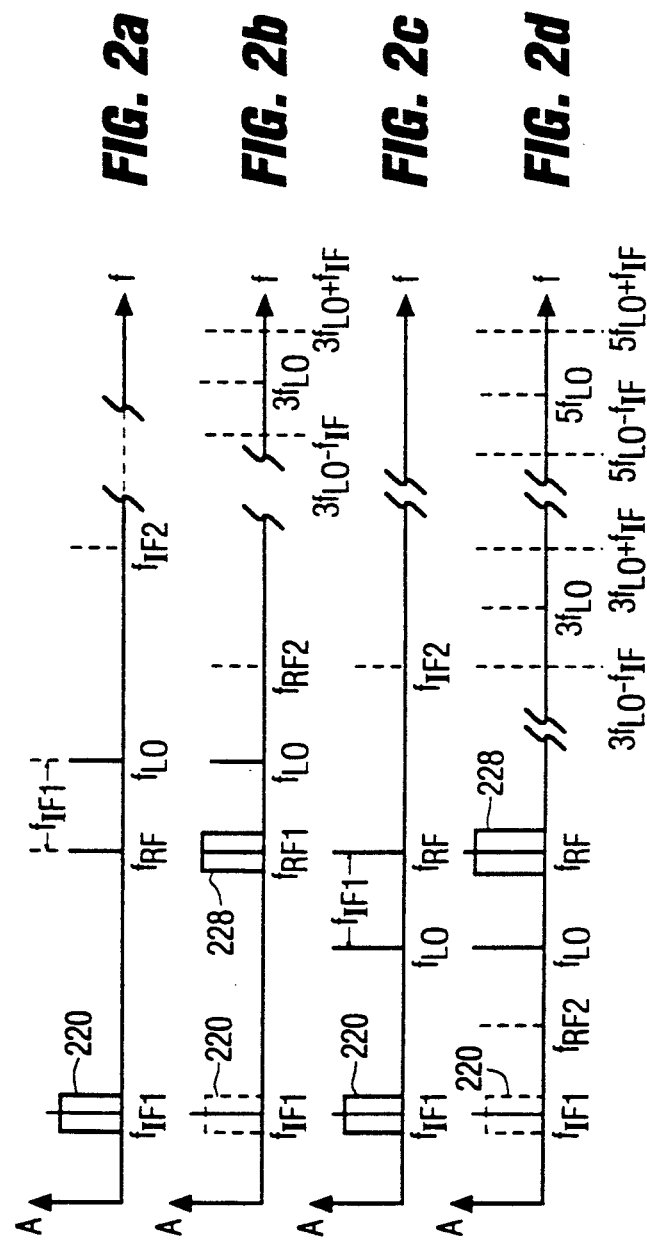

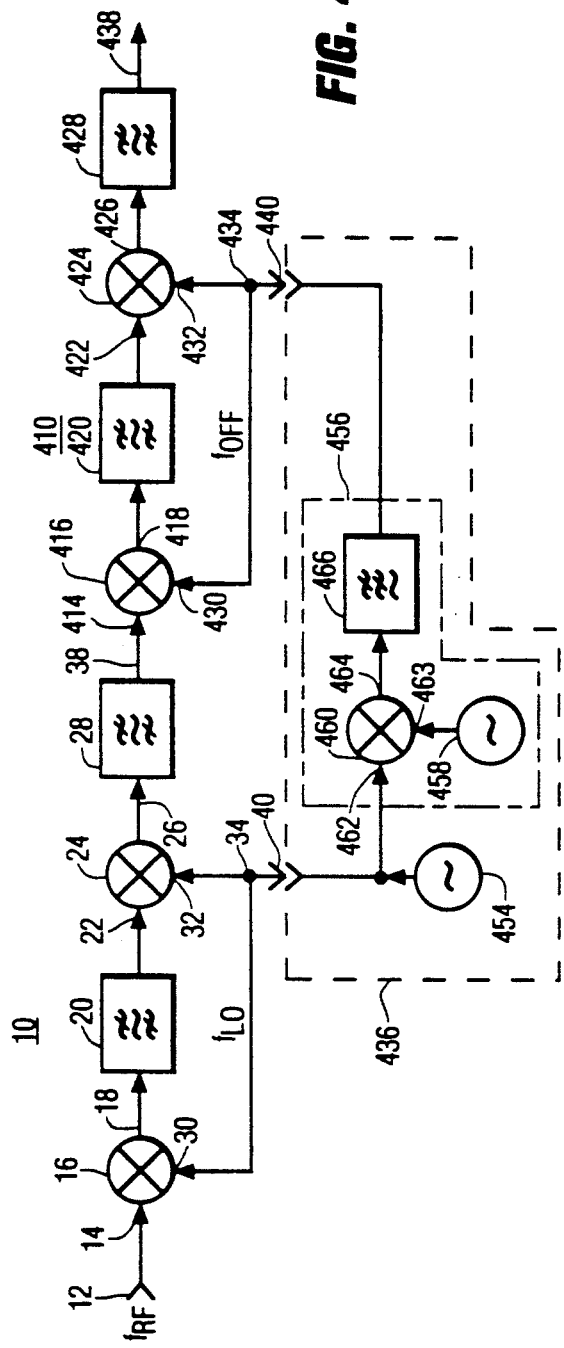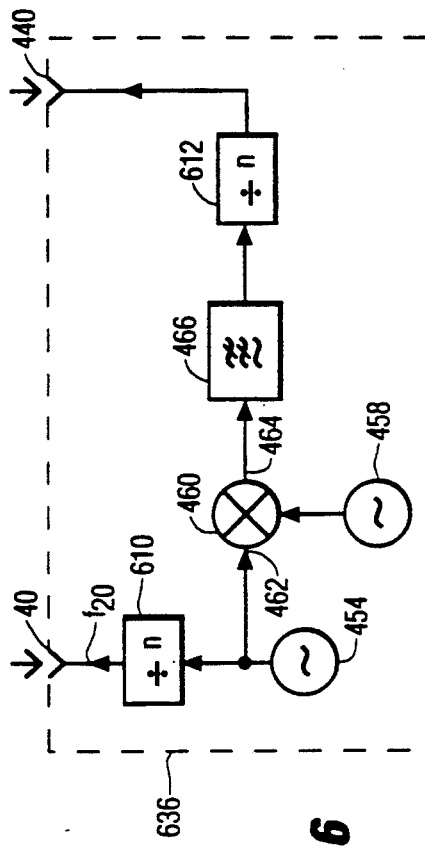
FIG. 4
FIG. 6

AGILE BANDPASS FILTER

BACKGROUND OF THE INVENTION

This invention relates to electronic filters of the bandpass type, and more particularly to bandpass filters in which the center frequency and the bandpass are controllable.

Electronic signal filters are ubiquitous in modern equipments, taking on innumerable low pass, bandpass and high pass configurations. The physical implementations change with advances in technology. Filters at 455 KHz for AM radios were at one time considered to be at a relatively high frequency, and were implemented using then advanced techniques. At the current state of the art, such filters are well within the "low" frequency range, and may be implemented in a variety of now-conventional manners.

For some purposes, as for example for spectrum analysis, or for system reconfiguration in communication satellites, it may be desirable to have filters in which the cutoff frequency of frequencies are adjustable, and also in which the bandwidth or bandpass is adjustable. At one time, such adjustments could be made only by mechanical tuning, using screw-mounted slugs and the like. Control speed, reliability and simplicity are enhanced by filters which are adjustable in frequency and passband by electronic signals.

SUMMARY OF THE INVENTION

An adjustable bandpass filter includes a first filter including an input terminal, an output terminal, and a control terminal. A second filter includes an input terminal, an output terminal, and a control terminal. The input terminal of the second filter is coupled to the output terminal of the first filter. The first filter is responsive to a first control signal applied to its control terminal for establishing the frequency of at least one of an upper frequency $f_1$ and a lower frequency $f_2$ defining the passband of the first filter. The second filter is responsive to a second control signal applied to its control input terminal for establishing the other one of the lower and upper frequency passed by the second filter to its upper terminal. The resulting cascade passes signal within a frequency range between the upper and lower frequencies. In a particular embodiment of the invention, at least one of the first and second filters is a bandpass filter arrangement which includes first and second mixers, each mixer including an input and output terminal, and each mixer also including a control input terminal. A fixed filter is connected between the output terminal of the first mixer and the input terminal of the second mixer, and the control terminals of the two mixers are connected in common to the source of control signal.

DESCRIPTION OF THE DRAWING

FIG. 1 is a simplified block diagram of a bandpass filter having an adjustable center frequency;

FIGS. 2a and 2b are amplitude-versus-frequency spectra which aid in understanding the operation of the filter of FIG. 1 in a first mode of operation or case, and FIGS. 2c and 2d are corresponding spectra for a second case;

FIG. 4 is a simplified block diagram of a cascaded filter in accordance with the invention;

FIGS. 6, 7 and 8 are simplified block diagrams which illustrate alternative configurations of a portion of the arrangement of FIG. 4.

DESCRIPTION OF THE INVENTION

Figure 3A:
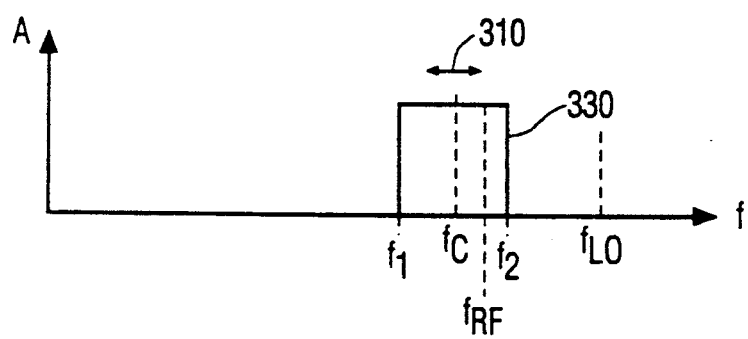
FIGS. 3a and 3b are simplified amplitude-versus-frequency spectra illustrating the result of the operation of the filter of FIG. 1 for the first and second case, respectively.

In FIG. 1, a bandpass filter designated generally as 10 includes an input terminal 12 adapted to receive a signal input $f_{RF}$, which is applied to an input terminal 14 of a mixer 16. An output terminal 18 of mixer 16 is connected to a fixed-frequency bandpass filter illustrated as a block 20. Filter 20 may be a filter using discrete inductors and capacitors, it may be a surface-acoustic wave filter, or it may be a microwave cavity filter. The output of bandpass filter 20 is applied to the input terminal 22 of a second mixer 24. Mixers 16 and 24 may, as known, be doubly-balanced mixers for suppressing unwanted signals. The output terminal 26 of mixer 24 is applied to the input of a further filter 28, which couples filtered signals to a conductor 38. Control input terminals 30 and 32 of mixers 16 and 24, respectively, are connected in common at a node 34, and to a source 36 of control signals.

The operation of the filter arrangement of FIG. 1 is readily explained with the aid of the frequency spectra of FIGS. 2a and 2b. In FIG. 2a, a rectangular region illustrated as 220 represents the bandpass of fixed filter 20 of FIG. 1. As mentioned, the center frequency of filter 20 is fixed. As illustrated in FIG. 2a, the input to the filter arrangement of FIG. 1 is at $f_{RF}$, which is at a frequency well away from filter passband 220. In order to convert $f_{RF}$ to a frequency range in which it may be filtered by fixed filter 20, the frequency $f_{LO}$ of the control signal produced by source 36 is selected so that the difference between the local oscillator frequency $f_{LO}$ and the signal input frequency $f_{RF}$ equals a frequency within passband 220. As illustrated in FIG. 2a, passband 220 is centered at a frequency $f_{IF1}$. Thus, the control frequency produced by source 36 of FIG. 1 is selected to be either $$\text{Case 1 } f_{LO} = f_{IF1} + f_{RF} \quad (1a)$$

$$\text{or Case 2 } f_{LO} = f_{RF} - f_{IF1} \quad (1b)$$

As is well known to those skilled in the art, mixer 16 produces a signal at $f_{IF1}$, and a second signal at $f_{IF2}$, as illustrated in FIG. 2a. The signal at frequency $f_{IF2}$ is outside the passband 220 of filter 20 of FIG. 1, and is stopped or rejected by the filter. Thus, only signal at frequency $f_{IF1}$, or close enough to $f_{IF1}$ to lie within the passband 220 of FIG. 2a, can reach input terminal 22 of mixer 24.

The control signal at frequency $f_{LO}$ produced by source 36 of FIG. 1 is also applied to the control input terminal 32 of output mixer 24. A signal at frequency $f_{IF1}$, or close to that frequency, is applied to input terminal 22 of mixer 24, and is illustrated in FIG. 2b. Mixer 24 responds to its input signal at terminal 22 and to the control signal to produce either (a) a difference signal at frequency $f_{RF1}=f_{LO}-f_{IF1}$ and a sum signal at frequency $f_{RF2}=f_{LO}+f_{IF1}$ for Case 1, with additional side bands at $3f_{LO}\pm f_{IF}$, $5f_{LO}\pm f_{IF}$..., as illustrated in FIG. 2b, or (b) a sum signal at frequency $f_{RF}$ and a difference signal at frequency $f_{LO}-f_{IF1}$, with additional sidebands at 3 for $f_{LO}-f_{IF1}$, $5f_{LO}-f_{IF1}$... as illustrated in FIG. 2d. Filter 28 of FIG. 1 has a band-pass characteristic illustrated at 228 of FIGS. 2b and 2d, which includes frequency fm, and which does not include any of the other principal frequencies. Thus, only frequency $f_{RF}$, and frequencies near $f_{RF}$ as established by the bandpass 220 of filter 20, are produced on output conductor 38 of FIG. 1. The passband frequencies of filter characteristic 228 are selected to eliminate or substantially reduce the previously mentioned undesirable frequency components $f_{RF2}$, $3f_{LO}-f_{IF}$, $3f_{LO}+f_{IF}$, $5f_{LO}-f_{IF}$, $5f_{LO}+f_{IF}$, $f_{LO}$, $3f_{LO}$, $5f_{LO}$, etc., but need not be as narrow as bandpass 220.

Figure 3B:
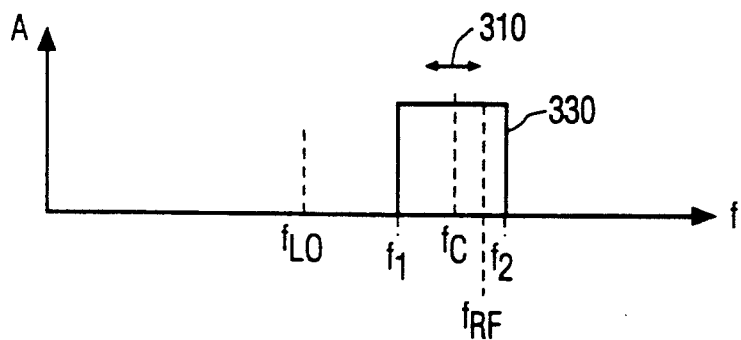

Viewing filter arrangement 10 of FIG. 1 as a "black box", its response to control signals may be represented as illustrated in FIG. 3a for Case 1 or in FIG. 3b for Case 2. In FIGS. 3a and 3b, a typical input signal frequency $f_{RF}$ is illustrated, together with an effective system bandpass illustrated as 330, which is movable in frequency in the direction of arrows 310 in response to adjustment of frequency $f_{LO}$ of FIG. 1. Thus, selection of frequency $f_{LO}$ of source 36 of FIG. 1 controls the center frequency of bandpass characteristic 330 of FIG. 3. Bandpass 330 has a lower cutoff frequency illustrated as $f_1$ in FIGS. 3a and 3b, and an upper cutoff frequency $f_2$. The difference between frequencies $f_2$ and $f_1$ is identical to that of bandpass 220 of FIG. 2a. However, because the center frequency $f_C$ of bandpass 330 is higher than the center frequencies $f_{IF1}$ of bandpass 220 of FIGS. 2a or 2c, the percentage bandwidth of bandpass 330 is smaller than the percentage bandwidth of bandpass 220 of FIG. 2a. However, the absolute bandwidth of bandpass 330 equals the absolute bandwidth of bandpass 220. Thus, the arrangement of FIG. 1 is capable of providing a very narrow effective bandwidth at arbitrarily high frequencies, at which narrow bandwidths are difficult to achieve by direct filtration.

FIG. 4 is a simplified block diagram of a cascade of two filters similar to that of FIG. 1, with a common control signal source. In FIG. 4, elements corresponding to those of the filter of FIG. 1 are designated by like reference numerals, and numerals relating to elements of the second filter with which it is cascaded are designated by the same reference numerals in the 400 series. In FIG. 4, filter arrangement 10 has already been described, as being in effect a constant-bandwidth filter having a center frequency movable in response to the control signals at frequency $f_{LO}$ applied to its control input terminal 40. Output conductor 38 of filter arrangement 10 is connected to input terminal 414 of a first mixer 416 of second filter arrangement 410, which in the embodiment of FIG. 4 is identical to filter arrangement 10. The output conductor of filter arrangement 10 is 438, at which the filtered signal appears. Filter arrangement 410 has a constant bandwidth, and a variable center frequency under the control of the control signal applied to its control input terminal 440. In accordance with an aspect of the invention, a control source 436 generates control signals for application to both control input terminals 40 and 440 of filter arrangements 10 and 410, respectively.

In FIG. 4, control arrangement 436 includes a signal source 454 which generates signals for application to control terminal 40, much as does signal source 36 of FIG. 1. A signal source 456 surrounded by a dot-dash line generates the control signals for application to control signal input terminal 440 of filter 410. Source 456 could in principle be an independent source of squarewave or sinusoidal signals at some frequency, and source 454 and 456 could be manually controlled to achieve the desired result, described below. According to an aspect of the invention, however, source 456 is slaved to source 454 to allow independent control of the total frequency and bandwidth of the filter arrangement represented by FIG. 4, and to reduce the effects of drift of two independent oscillators.

Source 456 of FIG. 4 includes a mixer 460 having its input terminal 462 connected to receive the control signal from source 454, and has its control input terminal 463 connected to a second source 458. Mixer 460 produces on its output terminal 464 signals at frequencies which are the sums and differences of the frequencies of the signals produced by sources 454 and 458. A bandpass filter illustrated as a block 466 selects a desired one of the mixed frequencies produced at output terminal 464 of mixer 460, and applies it to control input terminal 440 of filter 410. Source 456 as illustrated in FIG. 4 simply produces a control signal at terminal 440 which is at a constant frequency offset from the frequency produced by source 454, where the offset frequency equals the frequency of source 458. As explained below, this has the effect of operating filters 10 and 410 at center frequencies which are offset from each other by a frequency equal to the frequency produced by signal source 458.

Figure 5A:
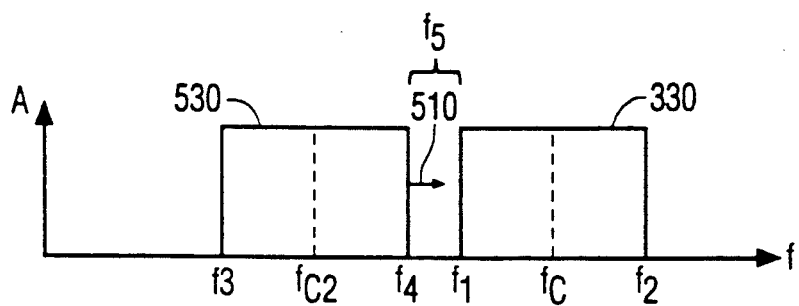
FIGS. 5a, 5b, 5c, 5d, and 5e are simplified amplitude-versus-frequency spectra illustrating the effect of cascading two filters of the type illustrated in FIG. 1, and response as a function of control of the center frequency.

In operation of the arrangement of FIG. 4, source 454 produces control signal at a frequency $f_{LO}$, which controls filter 10 as described above. The maximum frequency of source 458 is selected to be about equal to the absolute bandwidth of filter 20 or 420 of FIG. 4. Assuming that the maximum frequency to which source 458 may be set is slightly greater than the bandwidth of a filter 20 or 420, mixer 460 of FIG. 4 will produce at its output terminal 464 two signals, which are the sum and differences of the frequency produced by source 454, plus and minus the frequency of source 458. Assuming that lowpass filter 466 cuts off the sum frequency, source 456 will apply to control terminal 440 of filter 410 a frequency $f_{OFF}$ equal to frequency $f_{LO}$ produced by source 454, minus the offset frequency of source 458. This will cause the frequency of filter 410 to be somewhat lower than the control frequency applied to filter 10. The result of this condition is illustrated in FIG. 5a. In FIG. 5a, 330 represents the effective bandpass of filter 10 of FIG. 4 centered at a frequency of under the control of $f_{LO}$ produced by source 454, as illustrated in FIG. 3. Similarly, 530 of FIG. 5a represents the bandpass of filter 410 of FIG. 4, at a center frequency $f_{C2}$ which is somewhat lower than $f_C$, because of the lower frequency produced by source 456 of FIG. 4 relative to the frequency $f_{LO}$ of source 454. The lower and upper band edges of bandpass 530 are designated $f_3$ and $f_4$ for convenience. As mentioned above, source 458 was assumed to be at its maximum frequency, namely at a frequency slightly greater than the bandwidth of a filter 20 or 420, which frequency equals the absolute bandwidth $f_2$ minus $f_1$ of translated passband 330 of FIG. 5a. Thus, the difference between frequencies $f_C$ and $f_{C2}$ of FIG. 5a is slightly greater than frequency $f_2$ minus $f_1$. Thus, passbands 330 and 530 are separated by a frequency band illustrated as $f_5$ in FIG. 5a. That is to say, frequencies at or near $f_{RF}$ of FIG. 4, which pass through filter 10 of FIG. 4, arrive at filter 410 with frequencies lying between $f_1$ and $f_2$ of FIG. 5a. With the illustrated setting of source 458 of FIG. 4 at its maximum value, the passband 530 of filter 410 is outside any of the frequencies which are applied to filter 410, whereupon all signals which can be passed by filter 10 are within the reject portion of the band of filter 410. Thus, no signals can pass through the cascaded filters of FIG. 4.

Figure 5B:
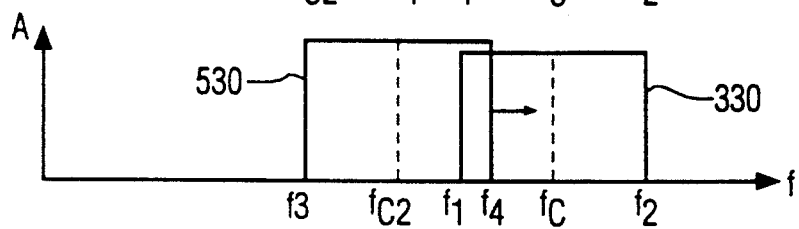

As the frequency of source 458 is decreased, passband 530 moves in the direction of arrow 510 of FIG. 5a. As the frequency of source 458 of FIG. 4 is decreased further, passbands 330 and 530 will overlap, as illustrated in FIG. 5b. For purposes of clarity as is known to those skilled in the art, the amplitude of passband 530 is illustrated as being greater than that of passband 330. The overlap of passbands 330 and 530 in FIG. 5b which results in a range between frequencies $f_1$ and $f_4$, within which frequency signals can pass through both filters 10 and 410 of FIG. 4. At frequencies below frequency $f_3$ of FIG. 5b, signals applied to input port 12 of FIG. 4 are well outside the passband 330 of filter 410 of FIG. 4. At signal frequencies between $f_3$ and $f_1$ of FIG. 5b, signals applied to input port 12 of FIG. 4 are outside passband 330 of filter 10, but if they could pass through filter 10, they would lie within the passband of filter 410. At frequencies between frequencies $f_4$ and $f_2$ of FIG. 5b, signals applied to input port 12 of FIG. 4 lie within the passband of filter 10, and are coupled to conductor 38 of FIG. 4. However, frequencies in the range of $f_4$ to $f_2$ of FIG. 5b (and frequencies above frequency $f_2$) are outside the passband of filter 410 of FIG. 4 and fail to pass therethrough to output conductor 438. The net effect of the overlap of passbands 330 and 530 as illustrated in FIG. 5b is illustrated by net passband 520 of FIG. 5c.

Figure 5C:
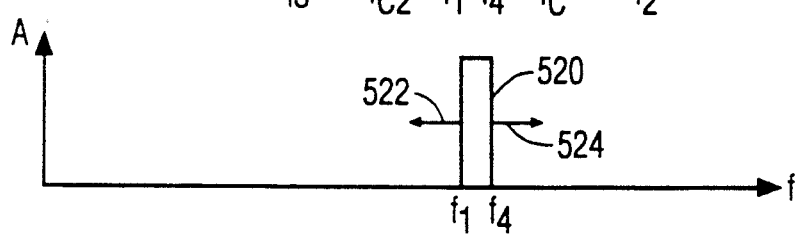
Figure 5D:
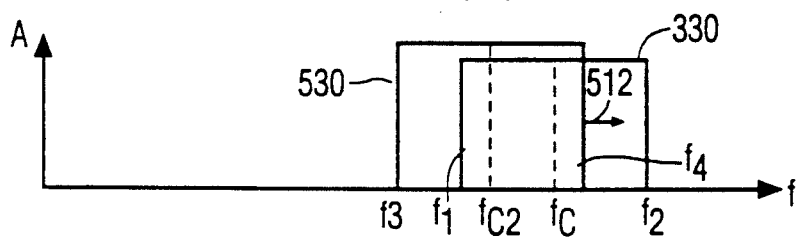

FIG. 5d illustrates the overlap resulting from a further decrease in the frequency of source 458 of FIG. 4, relative to the frequency of source 458 for FIGS. 5a, 5b and 5c. As illustrated in FIG. 5d, the center frequency $f_{C2}$ of passband 530 is very close to the lower frequency $f_1$ of passband 330, and the frequency $f_4$ of the upper edge of passband 530 is very near frequency $f_C$ of passband 330. This result occurs when the frequency of source 458 of FIG. 4 approximately equals one-half the bandpass of filter 20 or filter 420 of FIG. 4. Comparison of the bandpass $f_4$ minus $f_1$ of the cascade of filters, as illustrated in 5d, with that illustrated in FIG. 5c, reveals that a decrease of frequency of source 458 results in an increase in the bandpass, and also a shift in center frequency of the bandpass. Continued decrease of the frequency of source 458 results in "motion" of bandpass 530 in the direction of arrow 512 of FIG. 5d.

Figure 5E:
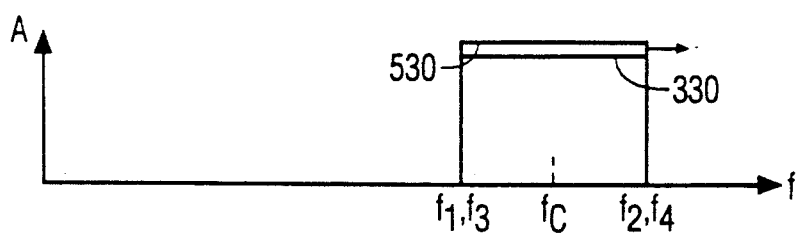

When the frequency of source 458 is zero, the input and output frequencies of mixer 460 are at the same frequency, namely $f_{LO}$, and both filters 10 and 410 have the same center frequency $f_C$, as illustrated in FIG. 5e. The upper and lower edges $f_2$, $f_4$ and $f_1$, $f_3$, respectively, of the passbands are congruent with this control signal relationship, and as a result the passbands fully overlap, as illustrated in FIG. 5e. This is the maximum possible passband of the arrangement of FIG. 4 with control signals in the frequencies described. As described, the passband can be modified from zero to the maximum passband of one of filters 20 or 420. As mentioned above in relationship to FIG. 3, the center frequency of the passband of filter 10, there illustrated as 330, can be moved in response to frequency $f_{LO}$. As illustrated in FIG. 4, however, frequency $f_{LO}$ is generated by source 454. As a consequence, the center frequency $f_C$ as illustrated in FIGS. 5a, 5b, 5d and 5e can be moved in frequency in response to the frequency of source 454, and the effective bandpass of the combined filter can be moved in response to the frequency of source 458. Thus, essentially complete control of the center frequency and bandpass of the filter is possible in response to control signals.

FIG. 6 illustrates an alternative arrangement 636 which may be substituted for control sources 436 of FIG. 4. In FIG. 6, control source arrangement 636 includes oscillator 454, offset oscillator 458 and mixer 460 and low pass filter 466, as described in conjunction with FIG. 4. In FIG. 6, oscillators 454 and 458 operate at higher frequencies than those illustrated in FIG. 4 for the same $f_{LO}$, and additional divide-by-n logic circuits illustrated as 610 and 612 are interposed between the sources and terminals 40, 440 for dividing down to the desired frequency. This avoids the need to operate oscillator 458 at frequencies close to zero.

Figure 8:
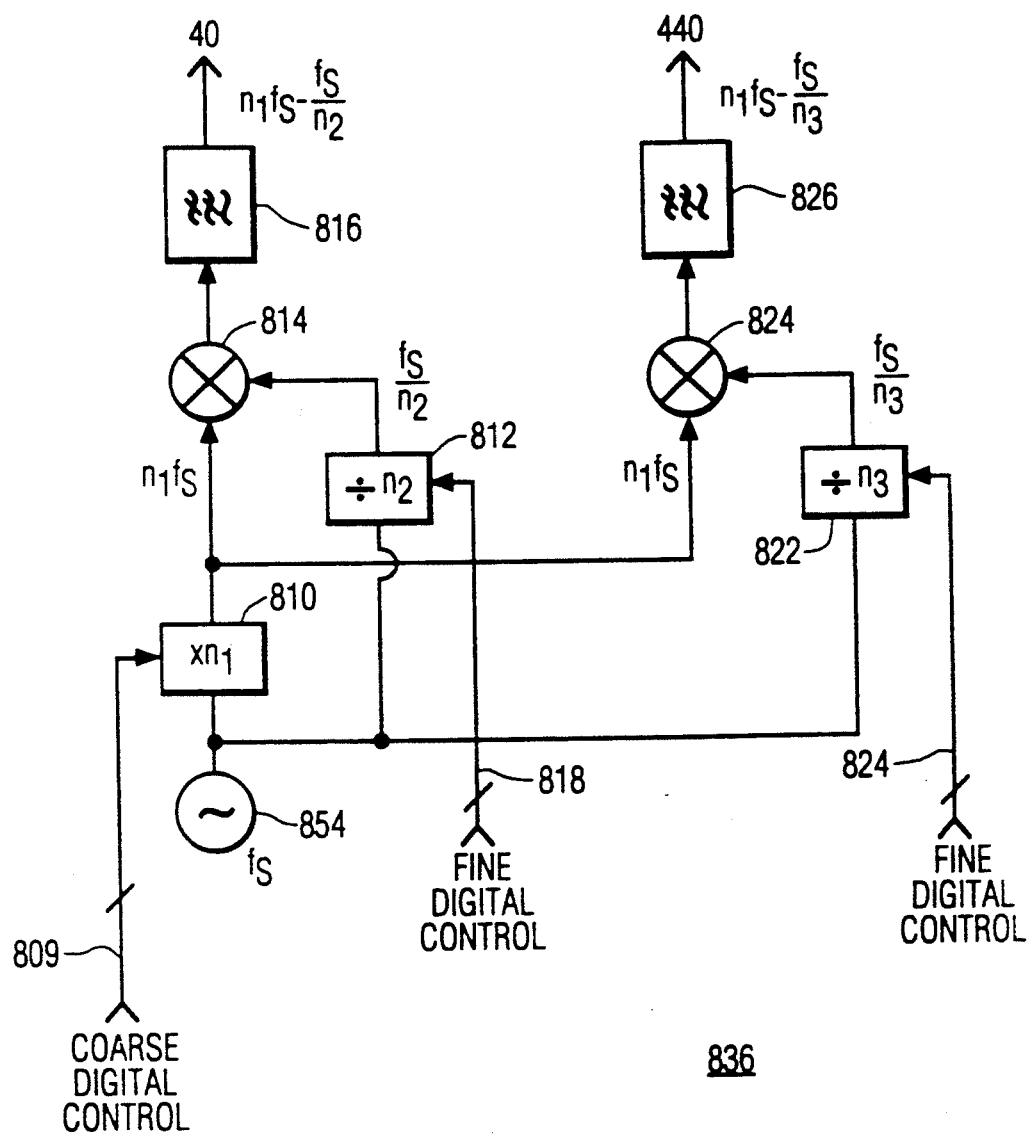

Conventional frequency synthesis techniques can be used to generate the required control signals. FIG. 8 is a simplified block diagram of a synthesizer system which may be substituted for source 436 of FIG. 4. Elements of FIG. 4 corresponding to those of FIG. 8 are designated by like reference numerals. In FIG. 8, an oscillator 854 produces signal at a frequency designated $f_S$, and applies the signal to a frequency multiplier designated 810, and to a divide-by-N circuit 812. The multiplication frequency of multiplier 810 is set to some value, such as $n_1$, under the control of coarse control signals applied over a datapath 809, so that the output frequency of multiplier 810 is $n_1 f_S$, which is applied to a mixer 814 and to another mixer 824. Frequency divider 812 divides in an amount, such as $n_2$, established by fine control signals applied over a data path 818. Thus, the divided output frequency from divider 812 is $f_S/n_S$, which is also applied to mixer 814. Mixer 814 produces sum and difference frequencies. The sum frequency is cut off or blocked by a low-pass filter 816, and difference frequency $n_1 f_S - f_S/n_2$ is made available at terminal 40 for application to mixers 16 and 24 of FIG. 4. Similarly, a fine control signal is applied over a data path 824 to a frequency divider 822, and is set to divide, for example, by $n_3$, so that a frequency $f_S/n_3$ is applied to mixer 824. The output signal from mixer 824 is filtered by a low-pass filter 826 to pass signal with a frequency $n_1 f_S - f_S/n_3$ to terminal 440.

Figure 7:
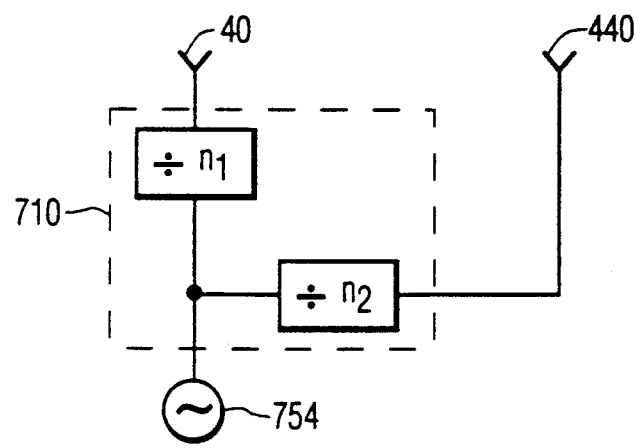

Other embodiments of the invention will be apparent to those skilled in the art, as for example, in FIG. 7, a single oscillator may be coupled to a logic circuit 710, for dividing the frequency of source 754 by different values $n_1$, $n_2$ to produce the desired signal at control signal terminals 40 and 440.

What is claimed is:

1. A variable-bandpass filtering arrangement, comprising:
   a first source of control signals at a selectable first frequency;
   a first bandpass filter circuit including signal input and output ports, and a control port for receiving control signals at said first frequency, for filtering signals translating between said signal input port and said signal output port of said first bandpass filter circuit with a bandpass characteristic which is responsive to said first frequency, said first bandpass filter circuit comprising first and second mixers, each of which mixers of said first bandpass filter circuit includes input and output ports and a control port, said input port of said first mixer of said first bandpass filter circuit being coupled to receive said signals applied to said signal input port of said first bandpass filter circuit, and said output port of said second mixer of said first bandpass filter circuit being coupled to said signal output port of said first bandpass filter circuit, and said control ports of said first and second mixers of said first bandpass filter circuit being coupled in common, without intermediary frequency-changing means, to said control port of said first bandpass filter circuit, said first bandpass filter circuit further comprising fixed bandpass filter means coupled to said output port of said first mixer of said first bandpass filter circuit and to said input port of said second mixer of said first bandpass filter circuit;

means for coupling said control port of said first bandpass filter circuit to said first source, whereby said control signals at said first frequency are applied to said control ports of said first and second mixers of said first bandpass filter circuit, and whereby said signals translating between said signal input and signal output ports of said first bandpass filter circuit are sequentially frequency-converted in a first direction by said first mixer, bandpass filtered by said fixed bandpass filter means, and frequency-converted in a second direction, opposite to said first direction, by said second mixer of said first bandpass filter circuit;

a second bandpass filter circuit including signal input and output ports, and a control port for receiving control signals at a second frequency, for filtering signals translating between said signal input port and said signal output port of said second bandpass filter circuit with a bandpass characteristic responsive to said second frequency, said second bandpass filter circuit comprising first and second mixers, each of which mixers of said second bandpass filter circuit includes input and output ports and a control port, said input port of said first mixer of said second bandpass filter circuit being coupled to receive said signals applied to said signal input port of said second bandpass filter circuit, and said output port of said second mixer of said second bandpass filter circuit being coupled to said signal output port of said second bandpass filter circuit, and said control ports of said first and second mixers of said second bandpass filter circuit being coupled in common, without intermediary frequency-changing means, to said control port of said second bandpass filter circuit, said second bandpass filter circuit further comprising fixed bandpass filter means coupled to said output port of said first mixer of said second bandpass filter circuit and also coupled to said input port of said second mixer of said second bandpass filter circuit;

means for coupling said output port of said first bandpass filter circuit to said input port of said second bandpass filter circuit;

a second source of control signals at a selectable second frequency, which second frequency may equal said first frequency; and means for coupling said control input port of said second bandpass filter circuit to said second source, whereby said control signals at said second frequency are applied to said control ports of said first and second mixers of said second bandpass filter circuit, and whereby the frequency of said bandpass characteristic of said second bandpass filter circuit is responsive to said second frequency, and whereby said frequencies of said bandpass characteristics of said first and second bandpass filter circuits are cascaded to produce a selectably variable bandwidth.

2. A variable-bandpass filtering arrangement, comprising:

a first source of control signals at a selectable first frequency;

a first bandpass filter circuit including signal input and output ports, and a control port for receiving control signals at said first frequency, for filtering signals translating between said signal input port and said signal output port of said first bandpass filter circuit with a bandpass characteristic which is responsive to said first frequency, said first bandpass filter circuit comprising first and second mixers, each of which mixers of said first bandpass filter circuit includes input and output ports and a control port, said input port of said first mixer of said first bandpass filter circuit being coupled to receive said signals applied to said signal input port of said first bandpass filter circuit, and said output port of said second mixer of said first bandpass filter circuit being coupled to said signal output port of said first bandpass filter circuit, and said control ports of said first and second mixers of said first bandpass filter circuit being coupled in common to said control port of said first bandpass filter circuit, said first bandpass filter circuit further comprising fixed bandpass filter means coupled to said output port of said first mixer of said first bandpass filter circuit and to said input port of said second mixer of said first bandpass filter circuit;

means for coupling said control port of said first bandpass filter circuit to said first source, whereby said signals translating between said signal input and signal output ports of said first bandpass filter circuit are sequentially frequency-converted in a first direction by said first mixer, bandpass filtered by said fixed bandpass filter means, and frequency-converted in a second direction, opposite to said first direction, by said second mixer of said first bandpass filter circuit;

a second bandpass filter circuit including signal input and output ports, and a control port for receiving control signals at a second frequency, for filtering signals translating between said signal input port and said signal output port of said second bandpass filter circuit with a bandpass characteristic responsive to said second frequency, said second bandpass filter circuit comprising first and second mixers, each of which mixers of said second bandpass filter circuit includes input and output ports and a control port, said input port of said first mixer of said second bandpass filter circuit being coupled to receive said signals applied to said signal input port of said second bandpass filter circuit, and said output port of said second mixer of said second bandpass filter circuit being coupled to said signal output port of said second bandpass filter circuit, and said control ports of said first and second mixers of said second bandpass filter circuit being coupled in common to said control port of said second bandpass filter circuit, said second bandpass filter circuit further comprising fixed bandpass filter means coupled to said output port of said first mixer of said second bandpass filter circuit and also coupled to said input port of said second mixer of said second bandpass filter circuit;

means for coupling said output port of said first bandpass filter circuit to said input port of said second bandpass filter circuit;

a second source of control signals at a selectable second frequency, which second frequency may equal said first frequency, wherein said second source of control signals comprises (a) a fifth mixer including input, output and control ports, said input port of said fifth mixer being coupled to said first source of control signals and (b) a third source of control signals at a selectable third frequency coupled to said control port of said fifth mixer for mixing said control signals at said third frequency with said control signals at said first frequency to produce said control signals at said second frequency; and means for coupling said control input port of said second bandpass filter circuit to said second source, whereby the frequency of said bandpass characteristic of said second bandpass filter circuit is responsive to said second frequency, and whereby said frequencies of said bandpass characteristics of said first and second bandpass filter circuits are cascaded to produce a selectably variable bandwidth.

3. Arrangement according to claim 2, further comprising a low-pass filter coupled between said output port of said fifth mixer and said control input port of said second bandpass filter circuit for filtering said control signals at said second frequency.

4. An arrangement according to claim 2, wherein said means for coupling said output port of said first bandpass filter circuit to said input port of said second bandpass filter circuit comprises a bandpass filter.

5. An arrangement according to claim 2, further comprising bandpass filter means coupled between said output port of said second mixer of said second bandpass filter circuit and said output port of said second bandpass filter circuit.

6. An arrangement according to claim 1, wherein one of said first and second sources of control signals comprises frequency division means.

7. An adjustable bandpass filter arrangement, comprising:

first filter means including signal input, signal output, and frequency control terminals, for responding to a first control signal applied to said frequency control terminal of said first filter means by establishing one of a lower frequency and an upper frequency bound on signals passing through said first filter means to said output terminal of said first filter means;

second filter means including signal input, signal output, and frequency control terminals, for responding to a second control signal applied to said control terminal of said second filter means by establishing the other one of said lower frequency and said upper frequency bounds on signals passing through said second filter means to said output terminal of said second frequency means; and means for coupling said output terminal of said first filter means to said input terminal of said second filter means to thereby define a passband filter with a passband lying between said upper and lower frequencies;

a source of said first control signal;

a source of a difference signal; and summing means coupled to said sources of first control and difference signals for generating said second control signal as one of the sum and differences of said first control and differences signals.

8. A filter according to claim 7, wherein said first control signal is at a predetermined frequency, said difference signal is at a second frequency, and further wherein said summing means comprises:

signal mixing means coupled to said sources of first control and difference signals, for mixing said first control and difference frequencies to produce said second control signals.

* * * * *